United States Patent
Sano et al.

(10) Patent No.: US 8,436,349 B2
(45) Date of Patent: May 7, 2013

(54) THIN-FILM TRANSISTOR FABRICATION PROCESS AND DISPLAY DEVICE

(75) Inventors: Masafumi Sano, Yokohama (JP); Ryo Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 156 days.

(21) Appl. No.: 12/524,138

(22) PCT Filed: Feb. 18, 2008

(86) PCT No.: PCT/JP2008/053109
§ 371 (c)(1),
(2), (4) Date: Jul. 22, 2009

(87) PCT Pub. No.: WO2008/105347
PCT Pub. Date: Sep. 4, 2008

(65) Prior Publication Data
US 2010/0044701 A1  Feb. 25, 2010

(30) Foreign Application Priority Data

Feb. 20, 2007 (JP) .................. 2007-039363
May 23, 2007 (JP) .................. 2007-136697
Feb. 7, 2008 (JP) .................. 2008-028001

(51) Int. Cl.
*H01L 29/10* (2006.01)
(52) U.S. Cl.
USPC ................ 257/43; 438/104; 257/E33.019
(58) Field of Classification Search ............ 438/149, 438/151, 157, 166; 257/43, E33.019
See application file for complete search history.

(56) References Cited

U.S. PATENT DOCUMENTS

| | | | |
|---|---|---|---|
| 6,346,184 B1 | 2/2002 | Sano et al. | 205/199 |
| 6,802,953 B2 | 10/2004 | Sano et al. | 205/333 |
| 7,145,174 B2 * | 12/2006 | Chiang et al. | 257/59 |
| 7,189,992 B2 | 3/2007 | Wager et al. | |
| 7,339,187 B2 * | 3/2008 | Wager et al. | 257/43 |
| 2003/0218222 A1 | 11/2003 | Wager et al. | |
| 2006/0110867 A1 | 5/2006 | Yabuta et al. | 438/151 |
| 2006/0113539 A1 | 6/2006 | Sano et al. | 257/59 |
| 2006/0197092 A1 * | 9/2006 | Hoffman et al. | 257/72 |

(Continued)

FOREIGN PATENT DOCUMENTS

| | | |
|---|---|---|
| CN | 1656618 A | 8/2005 |
| EP | 1 737 044 A1 | 12/2006 |

(Continued)

OTHER PUBLICATIONS

Kenji Nomura et al., "Room-temperature Fabrication or Transparent Flexible Thin-film Transistors Using Amorphous Oxide Semiconductors," 432 Nature 488-492 (Nov. 2004).

(Continued)

*Primary Examiner* — Tony Tran
(74) *Attorney, Agent, or Firm* — Fitzpatrick, Cella, Harper & Scinto

(57) ABSTRACT

In a process for fabricating a thin-film transistor in which a gate electrode 4 is to be formed on a substrate 1, the process has the steps of forming the gate electrode 4 on the substrate 1, forming a metal oxide layer 7 in such a way as to cover the gate electrode 4, forming a source electrode 6 and a drain electrode 5, and carrying out annealing in an inert gas to change part of the metal oxide layer 7 into a channel region.

2 Claims, 5 Drawing Sheets

U.S. PATENT DOCUMENTS

2007/0194379 A1 8/2007 Hosono et al.
2007/0252147 A1* 11/2007 Kim et al. ............... 257/59
2008/0108198 A1 5/2008 Wager, III et al. ............ 438/308

FOREIGN PATENT DOCUMENTS

| JP | 7331450 A | 12/1995 |
|---|---|---|
| JP | 8-264794 A | 10/1996 |
| JP | 2002-76356 A | 3/2002 |
| JP | 2006-165531 A | 6/2006 |
| JP | 2006/210472 A | 8/2006 |
| JP | 2006/237586 A | 9/2006 |
| WO | 2004/038757 A2 | 5/2004 |
| WO | 2005/088726 A1 | 9/2005 |
| WO | 2005/093846 A1 | 10/2005 |
| WO | 2005/093847 A1 | 10/2005 |
| WO | 2005/093848 A1 | 10/2005 |
| WO | 2005/093849 A1 | 10/2005 |
| WO | 2005/093850 A1 | 10/2005 |
| WO | 2005/093851 A1 | 10/2005 |
| WO | 2005/093852 A1 | 10/2005 |

OTHER PUBLICATIONS

Nikkei Microdevice, pp. 73-75 (Feb. 2006).
Patrial translation of Nikkei Microdevices, p. 73, (Feb. 2006), 3 pages.
Chinese Office Action issued in the counterpart application No. 200880005310.5, along with English-language translation, dated May 19, 2010—3 pages.
Office Action in Japanese Application No. 2007-136697, issued Aug. 7, 2012, with English translation (5 pages).

* cited by examiner

THIN-FILM TRANSISTOR FABRICATION PROCESS AND DISPLAY DEVICE

TECHNICAL FIELD

This invention relates to a process for fabricating a thin-film transistor, and to a display device. More particularly, it relates to a process for fabricating a thin-film transistor in the channel layer of which an oxide semiconductor is used, and to a display device making use of the thin-film transistor obtained.

BACKGROUND ART

Japanese Patent Application Laid-open No. 2002-76356 discloses a technique relating to a thin-film transistor (TFT) in the channel layer of which a transparent conductive oxide polycrystalline thin film is used which makes use of ZnO as its chief component. It is noted that this thin film can be formed at a low temperature and is transparent to visible light and hence a flexible transparent TFT can be fabricated on a substrate such as a plastic sheet or a film.

International Publication WO 2005/088726 A1 Pamphlet and Nature, 488, Vol. 432 (2004) also disclose a technique in which a transparent amorphous oxide semiconductor film composed of indium, gallium, zinc and oxygen, (a-IGZO film) is used in the channel layer of a TFT. It is further disclosed that a flexible and transparent TFT showing a good electric field effect mobility of 6 to 9 $cm^2V^{-1}s^{-1}$ can be fabricated at room temperature on a substrate such as a polyethylene terephthalate (PET) film.

Nikkei Microdevice, page 73, FIG. 7, the February issue, 2006, further discloses use of SiON in the insulating layer and inter-element isolation region of a thin-film transistor in the channel layer of which a-IGZO is used.

Including amorphous silicon thin-film transistors (TFTs), TFTs are commonly fabricated through many fine-processing steps. For the purpose of fabrication at low costs of TFTs which can enjoy stable operation, it is important to simplify such fine-processing steps.

In the case when the transparent semiconductor film containing zinc and oxygen is used in the channel region of a TFT, as disclosed in the above Japanese Patent Application Laid-open No. 2002-76356, International Publication WO 2005/088726 A1 Pamphlet and Nature, 488, Vol. 432 (2004), there involves the following difficulty.

The conductive transparent oxide channel region is formed by photolithography and by dry etching or wet etching. The dry etching is usually carried out using an expensive vacuum system, and this is a factor of an increase in fabrication cost. The wet etching is effective in view of cost reduction. In the wet etching, however, there are a case in which device size is limited because of, e.g., a low fine-processing precision, and adsorption of water content to the channel region due to wet processing, and a case in which a low through-put may result because a drying step must be added.

DISCLOSURE OF THE INVENTION

Accordingly, the present invention aims to provide a process for fabricating at low costs a thin-film transistor in which an oxide semiconductor is used, which thin-film transistor can be stable because of simplification of its fabrication steps, and provide a display device making use of the thin-film transistor obtained by such a process.

As a means for settling the above subject, the present invention provides a process for fabricating a thin-film transistor in which a gate electrode is to be formed on a substrate; the process comprising the steps of:

forming the gate electrode on the substrate;

forming a metal oxide layer in such a way as to cover the gate electrode;

forming a source electrode and a drain electrode; and carrying out heat treatment in an inert gas to change part of the metal oxide layer into a channel region.

The present invention also provides a process for fabricating a thin-film transistor in which a gate electrode is to be formed on a substrate; the process comprising the steps of:

forming the gate electrode on the substrate;

forming a gate insulating film in such a way as to cover the gate electrode;

forming a metal oxide layer on the gate insulating film;

forming a source electrode and a drain electrode; and carrying out heat treatment in an inert gas to change part of the metal oxide layer into a channel region.

According to the present invention, a metal oxide layer for forming therein a high-resistance region and a channel region is formed in a one-time film forming step. For example, a high-resistance metal oxide layer is formed, and part of the high-resistance layer is subjected to heat treatment to make it locally low in resistance. Then, the region having been made low in resistance is utilized as a channel region. As the result, the high-resistance region and the channel region can be formed by utilizing the metal oxide layer formed in the same film forming step. Making part of the metal oxide layer (high-resistance layer) locally change in quality in this way to form a region (channel region) which functions as a high-resistance region and a channel layer enables omission of the step of etching a semiconductor region that has conventionally been required.

The use of this oxide semiconductor thin-film transistor and its fabrication process can provide an electronic element formed of a stable thin-film transistor at low costs.

Further features of the present invention will become apparent from the following description of exemplary embodiments with reference to the attached drawings.

BEST MODE FOR CARRYING OUT THE INVENTION

Best-mode embodiments for practicing the present invention are described below with reference to the accompanying drawings.

The thin-film transistor according to the embodiments of the present invention is characterized in that the high-resistance region and the channel region are constituted by the same metal oxide layer.

Then, in the present invention, a specific metal oxide material described below is subjected to specific heat treatment to locally change the properties of the metal oxide material to thereby form the high-resistance region and the channel region by the use of the same amorphous oxide layer.

In the present invention, the wording "change part of the metal oxide layer into a channel region" means to make at least some region of the metal oxide layer locally change in quality by heat treatment so as to be changed to have electrical properties that fulfill the function as a channel layer of a semiconductor device.

Figure 8:
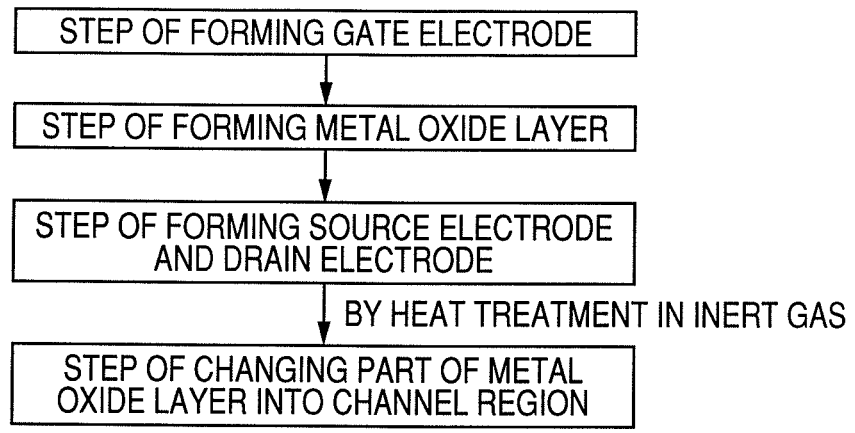
FIG. 8 is a diagram for explaining the steps of a process for fabricating a thin-film transistor according to the present invention.

Now, FIG. 8 shows a flow chart for explaining the steps of a process for fabricating a thin-film transistor which is an embodiment of the present invention. A process for fabricating a thin-film transistor in which a gate electrode is formed on a substrate is described along the steps of the process.

(Step of Forming a Gate Electrode)

In this step, according to the size of a substrate used and purposes thereof, the material for a gate electrode, gate electrode width and gate electrode film thickness are calculated and designed with voltage drop or heat quantity increased taken into account beforehand. The gate electrode may be formed through vapor deposition or sputtering method and photolithography process.

(Step of Forming a Metal Oxide Layer)

In this step, after the gate electrode is formed, a metal oxide layer is formed in such a way as to cover the gate electrode. A high-resistance film which can be used also as a gate insulating layer is formed by means of, for example, sputtering method. In this step, patterning by the photolithography process may be omitted.

(Step of Forming a Source Electrode and Drain Electrode)

In this step, a source electrode and drain electrode are formed of, for example, a metal at desired positions by patterning by the photolithography process.

(Step of Changing Part of the Metal Oxide Layer into a Channel Region)

This step is one of important steps in the present invention. In this step, part of the metal oxide layer (high-resistance layer) is locally modified in quality by carrying out heat treatment in an inert gas to form a high-resistance region and a region capable of acting as a channel layer (channel region). Furthermore, this step may be repeated in plurality of times to provide a desired channel region.

Thus, a desired thin-film transistor is fabricated through the above-mentioned steps.

Figure 9:
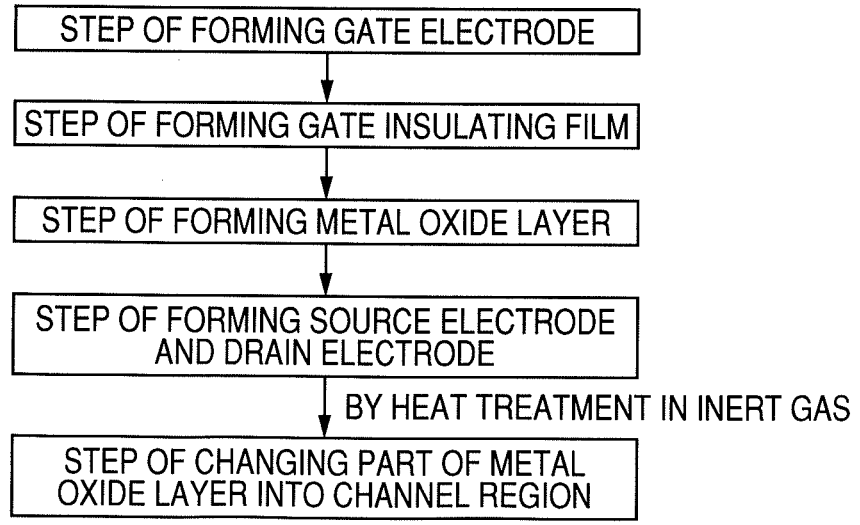
FIG. 9 is a diagram for explaining the steps of another process for fabricating a thin-film transistor according to the present invention.

Next, FIG. 9 shows a flow chart for explaining the steps of a process for fabricating a thin-film transistor which is another embodiment of the present invention. This process is provided with a separate step of forming a gate insulating layer. Each step of the process shown in FIG. 9 is described in the same manner as that for FIG. 8.

(Step of Forming a Gate Electrode on a Substrate)

In this step, according to the size of a substrate used in forming a gate electrode on the substrate and purposes thereof, the material for a gate electrode, gate electrode width and gate electrode film thickness are calculated and designed with voltage drop or heat quantity increased taken into account beforehand. The gate electrode may be formed through vapor deposition or sputtering method and photolithography process.

(Step of Forming a Gate Insulating Film)

In this step, a gate insulating film is formed in such a way as to cover the gate electrode. The gate insulating film must have at least film properties, film thickness and gate electrode coverage to such an extent that gate leakage current does not adversely affect the operation of thin-film transistor.

(Step of Forming a Metal Oxide Layer)

In this step, after the gate insulating film is formed, a metal oxide layer is formed. A high-resistance film which can be used also as a gate insulating film is formed in a thin film by means of, for example, sputtering method. The metal oxide layer can be formed in a thin film because it does not necessarily fulfill a function as a gate insulating film. In this step, patterning by the photolithography process may be omitted.

(Step of Forming a Source Electrode and Drain Electrode)

In this step, a source electrode and drain electrode are formed of, for example, a metal at desired positions by patterning by, for example, the photolithography process.

(Step of Changing Part of the Metal Oxide Layer into a Channel Region)

This step is one of important steps in the present invention. In this step, part of the metal oxide layer (high-resistance layer) is locally modified in quality by carrying out heat treatment in an inert gas to form a high-resistance region and a region capable of acting as a channel layer (channel region). Furthermore, this step may be repeated in plurality of times to provide a desired channel region.

Thus, a desired thin-film transistor is fabricated through the above-mentioned steps.

In the high-resistance region and channel region of the thin-film transistor according to the embodiments of the present invention, it is preferable to use an oxide containing Zn and In.

In the high-resistance region, it is preferable to use an amorphous oxide containing Zn and at least one of In, Ga, Al, Fe, Sn, Mg, Ca, Si and Ge and being $10^8$ Ω·cm or more in its resistivity. It is further preferable to use an amorphous oxide of $10^{10}$ Ω·cm or more in its resistivity.

The electronic element made up of the thin-film transistor according to the embodiments of the present invention may be used as a drive transistor of a display device. In such a case, the distance between source and drain electrodes of TFTs adjacent to one another may be about 10 μm and the width of each TFT in each pixel may be about 100 μm, as those assumed from pixel size of 200 dpi.

Figure 7:
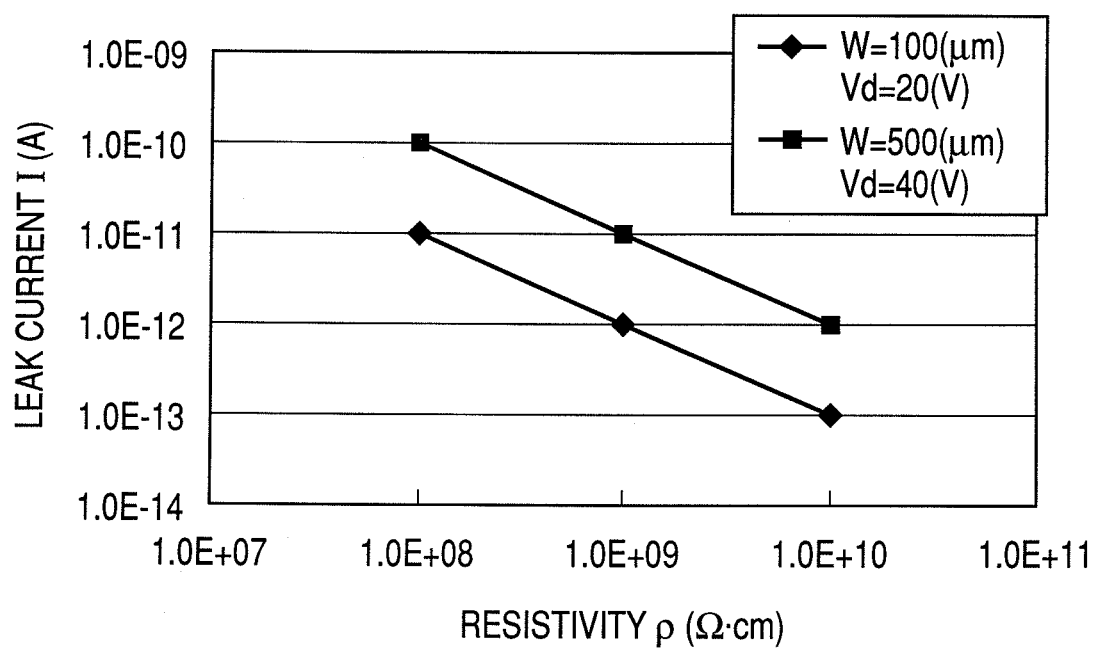
FIG. 7 is a graph showing the relationship between resistivity and leak current of a film.

Supposing that the high-resistance region which isolates these elements electrically from each other is 50 nm in layer thickness, its leak current estimated when the resistivity of that region (also called an inter-element isolation film) is set as a variable, it comes to what is shown in FIG. 7. To use the thin-film transistor as an organic EL device driving TFT, the high-resistance region (inter-element isolation film) is required to have a film resistivity of $10^{10}$ Ω·cm or more as stated above, because the above leak current is required to be $10^{-11}$ A or less.

A case in which the amorphous oxide semiconductor in the present invention is made to function as the high-resistance region (high-resistance layer) is further described next.

In the case of a polycrystalline transparent conductive oxide composed chiefly of ZnO, oxygen defects tend to occur to cause carrier electrons in large numbers. Also because of the presence of crystal grain boundaries, the resistivity becomes lower than the above value, and hence it is difficult to afford the high-resistance region at which the present invention aims.

In the present invention, a chemical element (stated specifically, Ga) is added which controls the generation of carrier electrons in the oxide semiconductor and also makes the oxide form an amorphous structure with ease, and this enables formation of an oxide film (high-resistance layer) having a high resistivity of $10^{10}$ Ω·cm or more that is enough to function as an inter-element isolation region.

As electrical properties required for the high-resistance region in the present invention, it may preferably have a resistivity of from $10^8$ Ω·cm or more to $10^{10}$ Ω·cm or less. If it has a high resistivity of $10^{10}$ Ω·cm or more, it is difficult for that region to be made into a channel layer after annealing. If on the other hand it has a resistivity of less than $10^8$ Ω·cm, the large leak current may be so large as to result in a low function as the inter-element isolation region (inter-element isolation film).

Meanwhile, the channel region in the present invention is that which is formed by making the oxide semiconductor change in electrical properties by subjecting the high-resistance region (high-resistance layer) to heat treatment, so as to function as a channel layer.

As electrical properties required for the channel region in the present invention, it may preferably have a resistivity of from $10^1$ Ω·cm or more to $10^7$ Ω·cm or less. If it has a resistivity beyond this range, low properties may result when made into the thin-film transistor. In the present invention, the following heat treatment (annealing) is carried out in order to make the high-resistance region change in quality so as to function as the channel region. That is, the heat treatment is carried out for tens of seconds to tens of minutes within the temperature range of from 150° C. to 250° C., at a pressure selected from the range of from vacuum to atmospheric pressure (e.g., from $1.1 \times 10^5$ Pa to $1.0 \times 10^{-3}$ Pa and in an atmosphere of an inert gas (such as $N_2$, Ar, He, Ne, Kr or Xe).

In the present invention, after the channel region has been subjected to the above heat treatment (annealing), it is important for that region to be kept in an amorphous state. For example, if the temperature range condition for the heat treatment (annealing) differs from the above range in the present invention, the channel region may come crystallized. If the channel region comes thus crystallized, the channel region may unnecessarily have a low resistance, so that it may have low properties as a channel or may come not to function as a channel.

In the present invention, as specific methods by which the metal oxide layer (or film) is locally made to change in resistivity (change in quality into the channel region), the following methods are available.

A metal or a material having a smaller band gap than the oxide insulating layer, such as ITO or IZO, is used in the source electrode or drain electrode, where the electrode is irradiated by using an ultraviolet lamp, a visible-light lamp, an infrared lamp, a near infrared lamp, a far infrared lamp or a visible-light laser. As a result of such irradiation, the source electrode or drain electrode is selectively heated, and hence the region adjoining to the electrode can be made locally low in resistance. In this case as well, like the foregoing, it is important that the amorphous state of the region having been subjected to the heat treatment (annealing) is kept before and after the heat treatment.

Besides, a metal is used in the source electrode or drain electrode, where the oxide semiconductor is irradiated by using an ultraviolet laser or an excimer laser. The electrode formed of the metal reflects (or can not easily absorb) ultraviolet laser or excimer laser. Hence, as a result of such irradiation, the region between the source electrode and the drain electrode can more quickly be made locally low in resistance and made into a channel region. In this case as well, like the foregoing, it is important that the amorphous state of the region having been subjected to the heat treatment (annealing) is kept before and after the heat treatment.

When a top-gate type TFT is used, a source electrode and a drain electrode are formed. Then, a high-resistance metal oxide film which can be used as a gate insulating layer is formed on both the source electrode and drain electrode, thereby forming a gate electrode at a desired position. The vicinities of the source electrode and drain electrode can be irradiated with the above-mentioned light source in an inert gas from the back side of the substrate, thereby performing the same heat treatment (annealing) as mentioned above. With the heat treatment, a high-resistance region and a region capable of acting as a channel layer (channel region) can be formed. In this case as well, it is important that the amorphous state of the region having been subjected to the heat treatment (annealing) is kept before and after the heat treatment.

Also in the top-gate type TFT, a source electrode and drain electrode are formed on the substrate, and then a gate insulating layer is formed on the source electrode and drain electrode. Thereafter, a high-resistance metal oxide film which can be used also as a gate insulting layer is formed. Then, a gate electrode is formed at a desired position and the above-mentioned heat treatment is conducted to fabricate a thin-film transistor. In this case, since the high-resistance metal oxide film does not always fulfill a function as a gate insulating layer, the metal oxide film can be formed in a film thickness enough to provide a region acting as a channel layer (channel region) after the annealing.

In the present invention, in the case when amorphous oxides containing In, Zn and O are used as the high-resistance region and channel region, the thin-film transistor can be fabricated at room temperature, and hence all film forming steps can be carried out at room temperature as long as the insulating layer is formed by a sputtering method.

As the substrate, usable are a metallic substrate and a glass substrate of course, and also a plastic substrate and a plastic film.

First Embodiment

Reverse Stagger Type TFT

Figure 1:
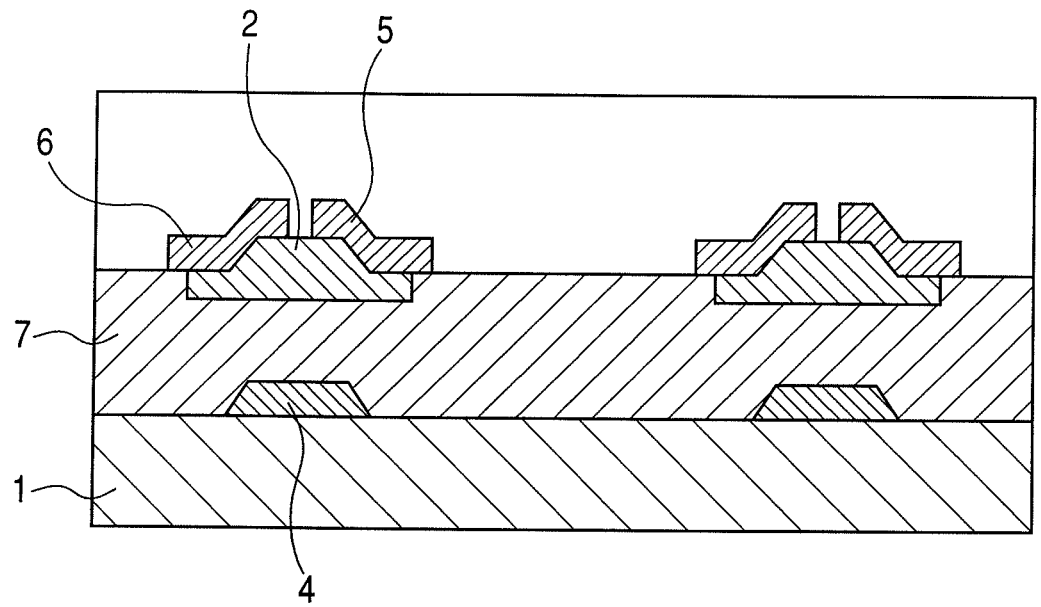
FIG. 1 is a sectional view showing a configuration of a thin-film transistor of bottom gate structure as a thin-film transistor according to a first embodiment of the present invention.

FIG. 1 is a sectional view showing the configuration of a thin-film transistor of bottom gate structure, as a thin-film transistor according to a first embodiment of the present invention.

A gate electrode 4 is provided on a substrate 1, and a high-resistance oxide layer 7 is provided thereon as the metal oxide layer, which shows a high resistivity of $10^{10}$ Ω·cm or more. On this layer 7, a source electrode 6 and a drain electrode 5 are provided. As materials for these electrodes, usable are, e.g., a metal selected from Mo, Ti, W and Al, or an alloy of any of these metals. For each electrode, at least one layer composed of any of these materials may be formed. Stated specifically, each electrode may be formed in three-layer structure in which a conductor composed of a metal having a relatively low resistance is held between top and bottom different conductors (such as Mo/W/Mo, Mo/Al/Mo, Ti/Al/Ti, Ti/Mo/Ti and MoW/Al/MoW).

Figure 3:
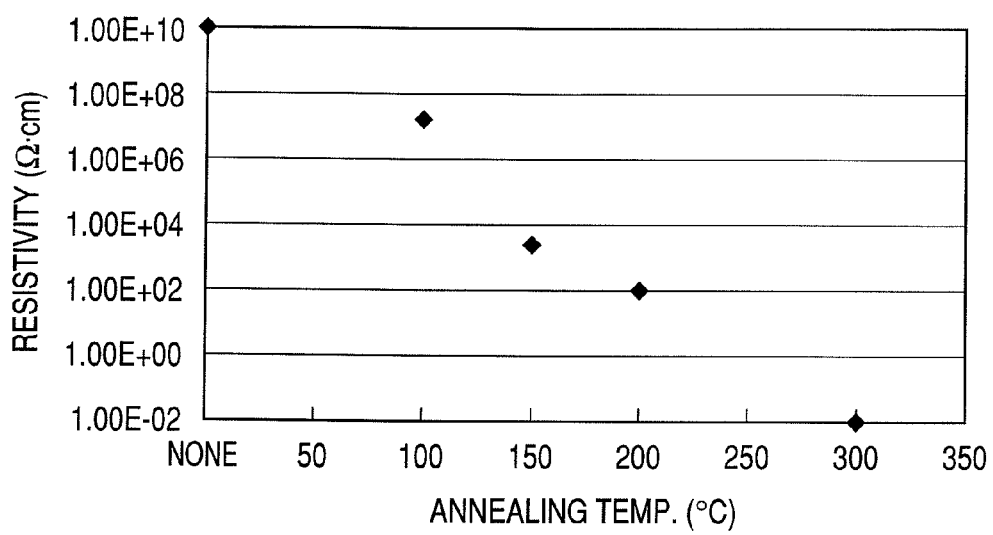
FIG. 3 is a graph showing changes in resistivity which are caused when a high-resistance amorphous In—Ga—Zn—O film is annealed in Ar gas.

Thereafter, on the basis of changes in resistivity as shown in FIG. 3 which are caused when the high-resistance oxide layer is subjected to heat treatment (hereinafter "annealing") in Ar gas, the annealing is carried out at a desired temperature to make part of the high-resistance oxide layer low in resistance to provide a channel region 2.

In this annealing, it is desirable to make the semiconductor region have a resistivity of from $10^3$ Ω·cm or more to $10^7$ Ω·cm or less. Making that region have this resistivity enables the thin-film transistor to achieve an electric field effect mobility of 1 $cm^2$/Vs or more. Here, a visible-light lamp is used to carry out irradiation for 10 minutes in an atmosphere of Ar gas at an atmospheric pressure to make locally low in resistance the region adjoining to the source electrode and drain electrode, thus forming a channel region.

In this way, a reverse stagger type bottom gate thin-film transistor can be fabricated in which the inter-element isolation region and the oxide semiconductor region are integrally formed without use of any step of etching the oxide semiconductor region.

Thus, such omission of the step of etching the oxide semiconductor region brings an improvement in through-put in manufacture. Further, any physical interface that may come due to the film formation for the oxide semiconductor layer and gate insulating layer is not present between them, and hence interface levels may reduce to enable remedy of hystereses and also improvement in long-term stability.

The amorphous state can be ascertained by the fact that any clear diffraction peak is not detected when a film for measurement is analyzed by X-ray diffraction at a low angle of incidence, e.g., at an angle of incidence of about 0.5 degree. The fact that any clear diffraction peak is not detected is that a halo pattern is observed.

Incidentally, the present embodiment by no means excludes that, where the above material is used in the inter-element isolation region and oxide semiconductor region of an electric field effect type transistor, the inter-element isolation region and the oxide semiconductor region contain a constituent material standing microcrystalline.

Second Embodiment

Reverse Stagger Type TFT

Figure 2:
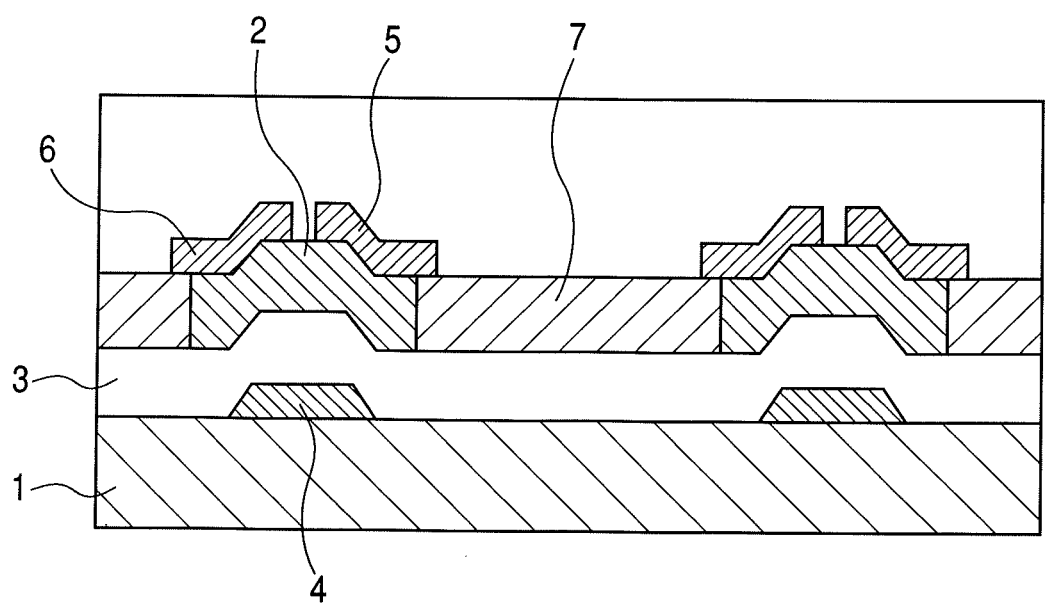
FIG. 2 is a sectional view showing a configuration of a thin-film transistor of bottom gate structure as a thin-film transistor according to a second embodiment of the present invention.

FIG. 2 is a sectional view showing the configuration of a thin-film transistor of bottom gate structure, as a thin-film transistor according to a second embodiment of the present invention.

A gate electrode 4 is provided on a substrate 1, and a gate insulating film 3 is further provided thereon. On this film 3, a high-resistance oxide layer 7 is provided as the metal oxide layer, which shows a high resistivity of $10^{10}$ Ω·cm or more. On this layer 7, a source electrode 6 and a drain electrode 5 are provided.

Thereafter, on the basis of changes in resistivity as shown in FIG. 3 which are caused when the high-resistance oxide layer is subjected to annealing in an inert gas, the annealing is carried out at a desired temperature to make part of the high-resistance oxide layer low in resistance to provide a channel region 2. He gas is used as the inert gas used when the annealing is carried out.

In this annealing, it is desirable to make the oxide semiconductor region have a resistivity of from $10^3$ Ω·cm or more to $10^7$ Ω·cm or less. Making that region have this resistivity enables the thin-film transistor to achieve an electric field effect mobility of 1 $cm^2$/Vs or more. Here, a near infrared lamp is used to carry out irradiation for 15 minutes in an atmosphere of He gas at an atmospheric pressure to make locally low in resistance the region adjoining to the source electrode and drain electrode, thus forming a channel region.

In this way, a reverse stagger type bottom gate thin-film transistor can be fabricated in which the inter-element isolation region and the oxide semiconductor region are integrally formed without use of any step of etching the oxide semiconductor region.

The amorphous state can be ascertained by the fact that any clear diffraction peak is not detected when a film for measurement is analyzed by X-ray diffraction at a low angle of incidence, e.g., at an angle of incidence of about 0.5 degree. The fact that any clear diffraction peak is not detected is that a halo pattern is observed.

Incidentally, the present embodiment by no means excludes that, where the above material is used in the inter-element isolation region and oxide semiconductor region of an electric field effect type transistor, the inter-element isolation region and the oxide semiconductor region contain a constituent material standing microcrystalline.

Third Embodiment

Display Device

To the drain electrode which is an output terminal of the above thin-film transistor, an electrode of a display element such as an electroluminescent (EL) element or a liquid-crystal element may be connected to make up a display device. Examples of how the display device is specifically made up are described below with reference to the drawings of display devices.

Figure 4:
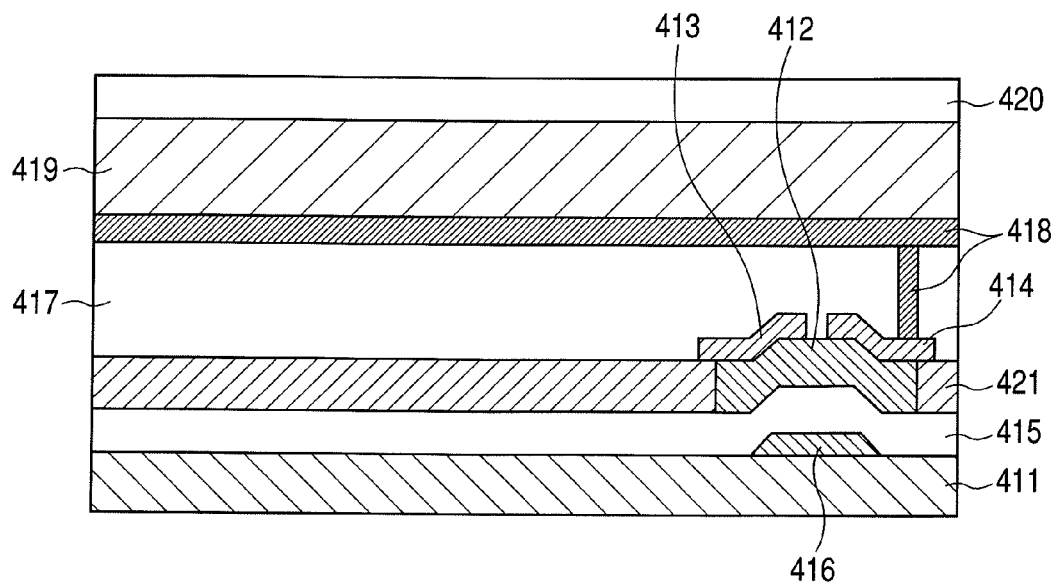
FIG. 4 is a sectional view showing an example of a display device in which an electroluminescent element as a display element is used.

FIG. 4 is a sectional view showing an example of display device in which an electroluminescent element as a display element is used.

For example, as shown in FIG. 4, a gate electrode 416 and a gate insulating film 415 are formed on a substrate 411, and thereafter on the gate insulating film 415 a high-resistance oxide layer 421 is formed, which shows a high resistivity. Further, a source electrode 413 and a drain electrode 414 are formed, and thereafter the annealing is carried out in an inert gas to make part of the high-resistance oxide layer 421 low in resistance to provide a channel region 412, thus a thin-film transistor is fabricated.

Then, to the drain electrode 414, an electrode 418 is connected through an interlayer insulating film 417. A light-emitting layer 419 is superposed on the electrode 418, and an electrode 420 is further superposed on the electrode 418.

With such configuration, the electric current fed into the light-emitting layer 419 can be controlled by the value of electric current flowing from the source electrode 413 to the drain electrode 414 through the channel region 412.

Thus, this can be controlled by the voltage of the gate electrode 416 of the thin-film transistor. Here, the electrode 418, the electrode 419 and the electrode 420 constitute an inorganic or organic electroluminescent element.

Figure 5:
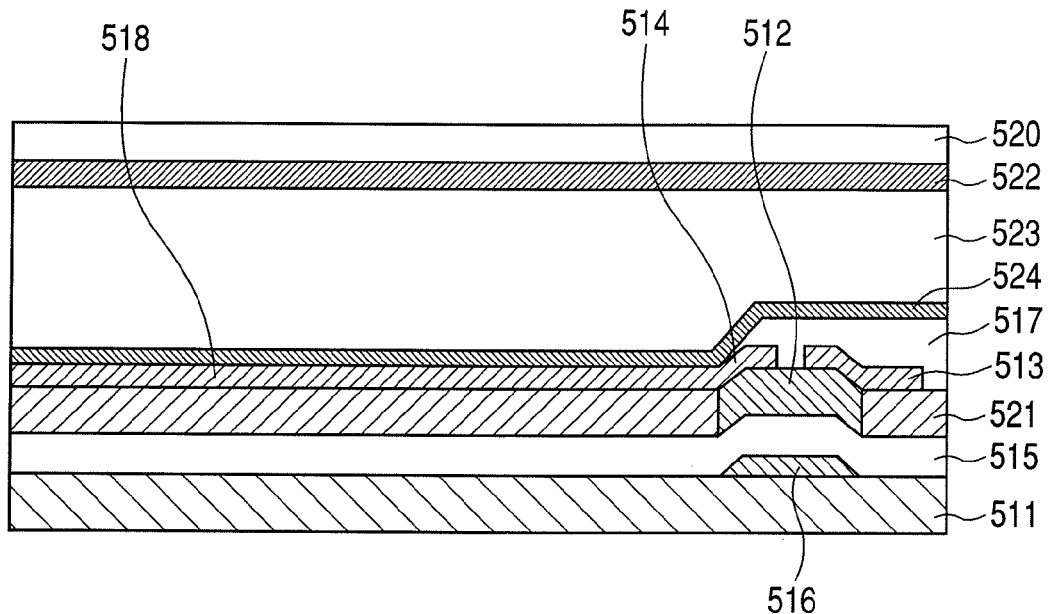
FIG. 5 is a sectional view showing an example of a display device in which a liquid-crystal cell as a display element is used.

FIG. 5 is a sectional view showing an example of a display device in which a liquid-crystal cell as a display element is used.

As shown in FIG. 5, the drain electrode 514 is extended so as to serve also as an electrode 518, and the display device may be so set up that this electrode may be an electrode 518 through which a voltage is applied to a liquid-crystal cell, or an electrophoresis type particle cell, 523 held between high-resistance films 522 and 524.

The liquid-crystal cell or electrophoresis type particle cell 523, the high-resistance films 522 and 524, the electrode 518 and the electrode 520 constitute the display element.

The voltage to be applied to any of these display elements can be controlled by the value of electric current flowing from the source electrode 513 to the drain electrode 514 through the channel region 512.

Thus, this can be controlled by the voltage of the gate electrode 516 of the thin-film transistor. Here, high-resistance films 522 and 524 are unnecessary so far as the display medium of the display element is a capsule formed by enclosing a fluid and particles in an insulating coating film envelope.

In the above two examples, examples are illustrated in each of which a pair of electrodes for driving the display element are provided in parallel to the substrate. The present embodiment is by no means limited to this make-up. For example, either of the electrodes or both the electrodes may be provided vertically to the substrate as long as the connection between the TFT output terminal drain electrode and the display element is phase-geometrically identical.

Further, in the above two examples, only one thin-film transistor is illustrated, which is connected to the display element. The embodiment is by no means limited to this make-up. For example, the thin-film transistor shown in each drawing may further be connected to other thin-film transistor (s). The thin-film transistor in the drawing may at least be the last stage of a circuit made up of such thin-film transistors.

Here, in the case when a pair of electrodes for driving the display element are provided in parallel to the substrate, either of the electrodes must be transparent to emitted light or reflected light so far as the display element is a reflection type display element such as an electroluminescent display element or a reflection type liquid-crystal display element. Instead, in the case of a transmission type display element such as a transmission type liquid-crystal display element, both the electrodes must be transparent to transmitted light.

Further, in the thin-film transistor in the display device of the present embodiment, all the constituent members may be set transparent, and this enables fabrication of a transparent display device.

Such a display device may also be fabricated by the use of a low heat resistant substrate such as a plastic substrate which is light-weight, flexible, transparent and made of a resin.

Figure 6:
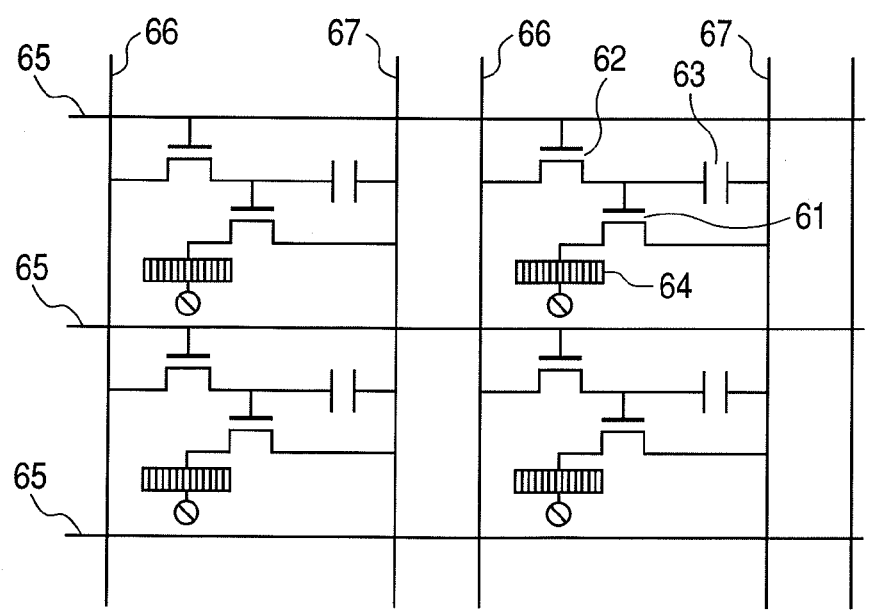
FIG. 6 is a circuit diagram showing a circuit of a display device in which pixels each containing an electroluminescent display element and a thin-film transistor are two-dimensionally arranged.

FIG. 6 is a circuit diagram showing a circuit of a display device in which pixels each containing an electroluminescent display element (here an organic electroluminescent display element) and a thin-film transistor are two-dimensionally arranged.

In FIG. 6, reference numeral 61 denotes a transistor which drives an organic EL layer; and 62, a transistor which selects a pixel. A capacitor 63 is a device for retaining the state that the pixel has been selected, and stores electric charges between a common electrode line 67 and the source portion of the transistor 62 to retain gate signals of the transistor 61. The selection of pixels is decided by scanning electrode lines 65 and signal electrode lines 66.

Stated more specifically, image signals are applied as pulse signals from a driver circuit (not shown) to the gate electrode through a scanning electrode line 65. At the same time, image signals are also applied as pulse signals from another driver circuit (not shown) to the transistor 62 through a signal electrode line 66, thus the pixel is selected.

At that moment, the transistor 62 comes into the on state, and electric charges are stored in the capacitor 63 located between the signal electrode line 66 and the source of the transistor 62, whereupon the gate voltage of the transistor 61 is kept to the desired voltage and the transistor 61 comes into the on state. This state is retained until the next signals are received. While the transistor 61 is in the on state, voltage and electric current are continued being fed to the organic EL layer 64, thus the emission of light is maintained.

In this example shown in FIG. 6, each pixel is made up of two transistors and one capacitor. In order to improve display performance, the transistors and so forth may be incorporated in a larger number in each pixel.

What is essential is that an In—Ga—Zn—O type thin-film transistor, which is the thin-film transistor according to the present invention, can be fabricated at a low temperature and is transparent, is used in the transistor portion, and this can bring an effective electroluminescent display element.

Examples of the present invention are demonstrated below with reference to the drawings.

Example 1

In this Example, a method of fabricating a reverse stagger (bottom gate) type MIS FET (metal insulator semiconductor field effect transistor) element is presented which is shown in FIG. 1.

First, on a glass substrate (1737, available from Corning Incorporated), a Ti 10 nm/Au 100 nm gate terminal is formed by photolithography and lift-off procedure. Further thereon, as a high-resistance oxide layer, showing a high resistivity, an amorphous In—Ga—Zn—O film is formed at room temperature by sputtering to have a thickness of 400 nm and a metal compositional ratio of In:Ga:Zn=1.00:0.94:0.65. A sintered body of In:Ga:Zn=1:1:1 is used as a sputtering target. In the sputtering, an oxygen-argon mixed gas is used as sputtering gas. The oxygen-argon mixed gas is set to be $5.0 \times 10^{-1}$ Pa in total pressure and $7.0 \times 10^{-2}$ Pa in oxygen partial pressure.

The film thus obtained can be obtained as a thin oxide film having the high resistivity of $10^{10}$ Ω·cm or more that is enough to function as an inter-element isolation region.

Thereafter, an Mo 100 nm/Ti 5 nm film is formed by electron beam vacuum deposition, followed by photolithography and lift-off procedure to form a source electrode and a drain electrode.

Further thereafter, the heat treatment amorphous In—Ga—Zn—O film, which is transparent to light of the visible-light region, is heated with a lamp in an atmosphere of an inert gas. Here, irradiation is carried out for 10 minutes in an atmosphere of Ar gas, at an atmospheric pressure and using a visible-light lamp, to make locally low in resistance the region adjoining to the source electrode and drain electrode, so that a channel region is formed.

The source and drain electrodes absorb and reflect the light of the lamp, and this enables the source and drain electrodes to be locally heated to 150° C. or more to 250° C. or less to form an oxide semiconductor region (the channel region).

Thus, it is able to complete the reverse stagger (bottom gate) type MIS FET element shown in FIG. 1, in which the inter-element isolation region and the oxide semiconductor region are integrally formed without use of any step of etching the oxide semiconductor region.

This MIS FET element can achieve an electric field effect mobility of 1 cm$^2$/Vs or more and an off current 1 E of −11 A or less Example 2

In this Example, a method of fabricating a reverse stagger (bottom gate) type MIS FET element is presented which is shown in FIG. 2.

First, on a glass substrate (1737, available from Corning Incorporated), a Ti 10 nm/Au 100 nm gate terminal is formed by photolithography and lift-off procedure. Further thereon, an insulating layer composed of a-SiOx is formed by sputtering in a thickness of 100 nm. In the sputtering, $SiO_2$ target is used as a sputtering target, and an oxygen-argon mixed gas is used as sputtering gas.

Then, on this insulating layer, an amorphous In—Ga—Zn—O film to be used as an inter-element isolation region and an oxide semiconductor region is formed at room temperature by sputtering to have a thickness of 35 nm and a metal compositional ratio of In:Ga:Zn=1.00:0.94:0.65. In the sputtering, an oxygen-argon mixed gas is used as sputtering gas. The oxygen-argon mixed gas is set to be $5.1 \times 10^{-1}$ Pa in total pressure and $6.5 \times 10^{-2}$ Pa in oxygen partial pressure.

The film thus obtained can be obtained as a thin oxide film having the high resistivity of $10^{10}$ Ω·cm or more that is enough to function as an inter-element isolation region.

Thereafter, the a-SiOx film as the insulating layer and the high-resistant amorphous In—Ga—Zn—O film, which are transparent to light of the visible-light region, are heated with a lamp in an atmosphere of an inert gas (He gas). Here, irradiation is carried out for 15 minutes in an atmosphere of He gas, at an atmospheric pressure and using a near infrared lamp, to make locally low in resistance the region adjoining to the source electrode and drain electrode, so that a channel region is formed.

Only the gate electrode absorbs and reflects the light of the lamp, and this enables only the gate electrode to be locally heated to 150° C. or more to 200° C. or less to form an oxide semiconductor region (the channel region).

Finally, an Au 100 nm/Ti 5 nm film is formed by electron beam vacuum deposition, followed by photolithography and lift-off procedure to form a source terminal and a drain terminal.

Thus, it is able to complete the reverse stagger (bottom gate) type MIS FET element shown in FIG. 2, in which the inter-element isolation region and the oxide semiconductor region are integrally formed without use of any step of etching the oxide semiconductor region.

This MIS FET element can achieve an electric field effect mobility of 1 $cm^2/Vs$ or more and an off current of $10^{-11}$ A or less.

Example 3

In this Example, the display device shown in FIG. 5 is described, which makes use of a liquid-crystal cell as a display element.

The steps of fabricating the thin-film transistor in Example 2 are repeated to fabricate the thin-film transistor as shown in FIG. 5.

In the above thin-film transistor, an island of an ITO film serving as the drain electrode is extended up to 100 μm at its short side. A portion of 90 μm of the film thus extended is left to secure wirings to the source electrode and gate electrode. In this state, the thin-film transistor is covered with an insulating layer to obtain a substrate member. On this member, a polyimide film is formed by coating, which is then subjected to rubbing.

Meanwhile, an ITO film and a polyimide film are formed on a plastic substrate in the same manner, followed by rubbing to prepare a substrate member, and this is set opposite leaving an air space of 5 μm, to the polyimide film formed on the aforesaid substrate member with the thin-film transistor formed, where a nematic liquid crystal is injected into this air space.

The structure thus obtained is further provided on its both sides with a pair of polarizing plates.

Here, a voltage is applied to the source electrode of the thin-film transistor, and the voltage applied to the gate electrode is changed, whereupon light transmittance changes only at a region of 30 μm×90 μm corresponding to a part of the ITO film island extended from the drain electrode. This light transmittance can also be continuously changed by source-to-drain voltage under application of gate voltage where the thin-film transistor comes into the on state.

Thus, the display device corresponding to the FIG. 5 device is fabricated, which makes use of the liquid-crystal cell as a display element.

Further, in this Example, the device may be so set up that a white plastic substrate is used as the substrate on which the thin-film transistor is to be fabricated, that each electrode of the thin-film transistor is replaced with a gold electrode, and that the polyimide film and the polarizing plates are removed.

Then, the device is so set up that the air space between the white and transparent substrates is filled with a capsule formed by enclosing particles and a fluid in an insulating coating film envelope.

In the case of the display device set up in this way, the voltage applied across the drain electrode extended according to this thin-film transistor and the upper part ITO film is controlled, whereby the particles in the capsule move up and down. In virtue of such movement, the reflectance as viewed from the transparent substrate side, of the drain electrode region extended is controlled, and this enables display.

In this Example, the thin-film transistor may also be fabricated in plurality so that thin-film transistors may stand adjacent to one another. For example, a current control circuit made up of four transistors and one capacitor may be set up, where one of the transistors at its final stage is so set as to be the thin-film transistor shown in FIG. 4, to drive the electroluminescent element.

For example, a thin-film transistor is used in which the above ITO film is set as the drain electrode. Then, an organic electroluminescent element consisting basically of a charge injection layer and a light-emitting layer is formed at the region of 30 μm×90 μm corresponding to a part of the ITO film island extended from the drain electrode. Thus, a display device can be fabricated which makes use of the electroluminescent element.

Example 4

In this Example, the display element and thin-film transistor (TFT) in Example 3 are two-dimensionally arranged.

For example, pixels each holding an area of about 30 μm×115 μm inclusive of that of the display element (such as the liquid-crystal cell and the electroluminescent element) and TFT in Example 3 are arranged in a number of 7,425×1,790 at pitches of 400 μm in the short-side direction and at pitches of 120 μm in the long-side direction.

Then, 1,790 lines of gate wirings and 7,425 lines of signal wirings are provided; the former passing through gate electrodes of 7,425 TFTs in the long-side direction, and the latter passing through source electrodes of 1,790 TFTs in the short-side direction at their portions protruding by 5 μm from islands of amorphous oxide semiconductor films. Then, these wirings are connected to a gate driver circuit and a source driver circuit.

Further, in the case of the liquid-crystal display element, color filters in which RGB stand repeated in long-side direction under positional alignment in the same size as the liquid-crystal display element may be provided on the surface, so that an active matrix type color image display device can be set up which is of about 211 ppi and A4 size.

In the case of the electroluminescent element as well, the gate electrode of a first TFT and the source electrode of a second TFT of two TFTs included in one electroluminescent element may be wired to the gate line and the signal line, respectively. Then, light emission wavelengths of electroluminescent elements may be repeated in RGB in the long-side direction. Thus, a light-emitting color image display device can be set up which has the same resolution for each element.

Here, the driver circuits which drive the active matrix may be made up using the TFTs according to the present invention which are the same as the TFTs of pixels, or using any existing IC chips.

Example 5

In this Example, an electrophoresis type display device is described which is made up like the liquid-crystal cell shown in FIG. 5.

The steps of fabricating the thin-film transistor are the same as those in Example 2. However, as the sizes of the thin-film transistor, the channel length is 70 μm, the channel width is 140 μm and the gate overlap length is 5 μm, thus a thin-film transistor adapted to pixel size is used.

In the above thin-film transistor, an island of an ITO film serving as the drain electrode is extended up to 338 μm at its short side. A portion of 230 μm of the film thus extended is left to secure wirings to the source electrode and gate electrode. In this state, the thin-film transistor is covered with an insulating layer.

An electrode is also formed on a transparent substrate (not shown), and its electrode side is so disposed as to be set opposite to the above ITO film side, leaving an air space, and this air space is sealed with partitions or the like so that a colored solvent containing electrophoretic particles may not leak. Thus, an electrode-to-electrode distance of 80 μm is secured. A solvent colored with a black coloring matter and white electrophoretic particles (titanium oxide having an average particle diameter of 6 μm) are dispersed between these electrodes. A voltage is applied thereto from the thin-film transistor side, and this enables black-and-white display.

Black-and-white display can also be performed where particles obtained by mixing carbon in polystyrene resin are used as colored electrophoretic particles (having an average particle diameter of 1.5 μm) in silicone oil as a colorless transparent liquid. The electrode in this case, however, may more preferably be formed of a high-reflectance metal because a higher contrast can be secured.

As the colored electrophoretic particles, a color toner may also be used which has a small particle diameter of 10 μm or less, and this enables color display with ease.

A cholesteric liquid crystal may also be injected into the space between these electrodes set opposite to each other, so as to reflect light suited to the properties of this cholesteric liquid crystal. This also enables color display.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-039363, filed Feb. 20, 2007, 2007-136697, filed May 23, 2007, and 2008-028001, filed Feb. 7, 2008 which are hereby incorporated by reference herein in their entirety.

The invention claimed is:

1. A process for fabricating a thin-film transistor in which a gate electrode is to be formed on a substrate, the process comprising the steps of:
    forming the gate electrode on the substrate;
    forming a metal oxide layer in such a way as to cover the gate electrode said metal oxide layer comprising Zn and further comprising at least one of In, Ga, Al, Fe, Sn, Mg, Ca, Si, and Ge, having a resistivity of from $10^8$ cm or more to $10^{10}$ Ωcm or less, and being amorphous; thereafter
    forming a source electrode and a drain electrode;
    carrying out heat treatment to the source electrode and the drain electrode at a temperature in the range from 150° C. to 250° C. by using any one of an ultraviolet lamp, a visible-light lamp, an infrared lamp, a near infrared lamp, and a far infrared lamp in a gas selected from the group consisting of $N_2$, Kr, and Xe to change a first part of the metal oxide layer into a channel region,
    wherein after the heat treatment, the channel region is amorphous and has a resistivity of from 10 Ωcm or more to $10^7$ Ωcm or less;
    wherein the heat treatment is subjected to the first part of the metal oxide layer, and wherein the heat treatment is not subjected to a second part of the metal oxide layer; and
    wherein the second part of the metal oxide layer is located outside the first part of the metal oxide layer.

2. The process for fabricating a thin-film transistor according to claim 1, wherein the first part of the metal oxide layer comprises a region adjoining the source electrode and the drain electrode.

* * * * *